United States Patent [19]

Sullivan

[11] Patent Number: 5,041,940
[45] Date of Patent: Aug. 20, 1991

[54] POWER TRANSISTOR CONTROL CIRCUIT PARTICULARLY FOR SWITCHING INCANDESCENT LAMPS

[75] Inventor: James D. Sullivan, Columbus, Ohio

[73] Assignee: Vanner, Inc., Columbus, Ohio

[21] Appl. No.: 530,473

[22] Filed: May 29, 1990

Related U.S. Application Data

[63] Continuation of Ser. No. 291,388, Dec. 27, 1988, abandoned, which is a continuation of Ser. No. 101,204, Sep. 25, 1987, abandoned.

[51] Int. Cl.$^5$ .............................................. H02H 7/00
[52] U.S. Cl. ........................................ 361/18; 361/89; 361/91; 323/277
[58] Field of Search ........................ 361/18, 45, 49, 58, 361/86, 89, 91, 94, 98; 307/97, 96, 132 R, 141, 141.4; 323/277, 278, 284, 288, 901, 242

[56] References Cited

U.S. PATENT DOCUMENTS 3,733,540  5/1973  Hawkins ............................. 323/288
4,127,885  11/1978  Adam et al. ......................... 361/18

Primary Examiner—Todd E. Deboer
Attorney, Agent, or Firm—Frank H. Foster

[57] ABSTRACT

A method and apparatus for switching an electrical load, such as an incandescent lamp, with a FET and providing protection for the FET. An exponential reference signal is generated which is a function of drain to source voltage and represents the integral of instantaneous power dissipated in the FET. Simultaneously, an exponential FET gate signal is initiated for turning on the lamp or other load at a rate which would maximize the power dissipation in the FET under worst case short circuit conditions. The integrated power signal is compared to a critical threshold level which represents the maximum power dissipation rating of the FET. In the event the integrated instantaneous power signal rises above the critical threshold level, which would occur because of an overload, the FET is turned off to protect it and the load from the overload condition.

17 Claims, 5 Drawing Sheets

POWER TRANSISTOR CONTROL CIRCUIT PARTICULARLY FOR SWITCHING INCANDESCENT LAMPS

This is a continuation of application Ser. No. 07/291,388, filed Dec. 27, 1988 now abandoned, which is a continuation of application Ser. No. 07/101,204, filed Sept. 25, 1987, now abandoned.

TECHNICAL FIELD

This invention is generally related to a switching circuit and more specifically is related to a method and apparatus for switching electrical loads such as incandescent lamps which increase in resistance as they warm up. The invention switches a lamp or other load in a manner which protects the circuitry while optimizing the turn on voltage characteristics of the power applied to the lamp or other load.

BACKGROUND ART

Incandescent lamps have long been used for illumination and signalling in a variety of applications, including on vehicles. Most applications require that the incandescent lamp be turned on and off in response to a manual actuation or a control circuit such at a signal flasher which automatically and periodically turns the lamp on and off.

Switching devices, which are used to control the application of electrical power to an incandescent lamp or other load, require overload protection so that the switching device will not be damaged or destroyed in the event of an overload, such as a short circuit or other reduced load impedance.

For conventional lamp flashers or other switches, the overload problem is solved by using a series connected fuse. Fuses are practical and solve the problem for mechanical switching devices, including bimetallic flasher switches, and for transistor flashers which use bipolar transistors. Although a fuse requires a substantial time delay until it opens, mechanical switches and bipolar transistors are not damaged within that time delay interval because they can dissipate the excess heat caused by the overload during that time interval.

However, such traditional switching devices are inefficient because they consume significant electric power. This is particularly undesirable in service vehicles which have auxiliary, electrically powered equipment which is powered from a storage battery and vehicle generators which regenerate the stored energy.

The semiconductor device manufacturing art has recently developed technology which has made power field effect transistors available which can operate at the operating currents of incandescent lamps and yet have the extremely high power efficiency which is characteristic of field effect transistors.

There is, therefore, a need for a load driver or switching circuit which can take advantage of the energy efficiency of the power FET and yet will provide for overload, short circuit, and reverse voltage protection.

For example, a lamp or other load driver should be overload proof so that, if a lower impedance load is connected to the driver than the driver is designed to handle, the device will cease operating without any damage. The load should be protected and the switching device should be protected in the event the load is short circuited and an extremely high current is demanded by the short. If the load is short circuited, the driver would desirably turn off before any damage can occur. Finally, it is desirable that the device, particularly if used as a two terminal flasher, be reverse voltage protected in the event it is incorrectly installed.

These advantages and features are attained in embodiments of the invention. In addition, the invention also provides a "soft" turn on characteristic which gradually turns an incandescent lamp on in a manner which is recommended by incandescent lamp manufacturers.

BRIEF DISCLOSURE OF INVENTION

The invention is a method and an apparatus for switching on a power switching transistor which is connected to a power supply and a load, such as an incandescent lamp. The transistor is preferably an FET and has a region of substantially linear operation. The method and the circuitry protect the transistor from excess, internally generated heat while minimizing the turn on time of the transistor.

An input control signal is applied to the control input of the transistor, such as the gate of the FET, for turning on the transistor as an increasing function of time. Preferably, the control signal drives the control input to an amplitude which corresponds to a selected, maximum transistor output terminal current which is not destructive of the transistor and which drives the transistor to that current within a time interval which does not exceed the time interval for which application of full power supply voltage to the output terminals of the transistor at the selected maximum current would exceed the maximum power dissipation rating for the transistor. A power signal is detected from the output terminals of the transistor which is substantially an increasing, continuous function of the instantaneous power dissipated in the transistor. The instantaneous power signal is integrated over a time interval which does not exceed the maximum transient time during which the transistor can temporarily exceed its maximum average power dissipation rating in order to obtain an average short term power dissipation signal for that time interval. The integrated short term power signal is compared to a selected maximum average power dissipation rating signal and the transistor is turned at least partially off and preferably completely off in response to the integrated short term power signal exceeding the maximum average power dissipation rating signal.

Figure 1:
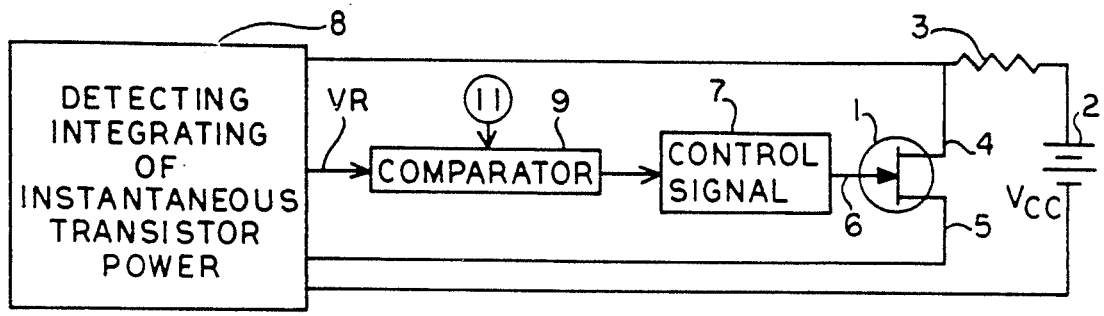
FIG. 1 is a simplified block diagram illustrating the invention.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art. In addition, it should be recognized that the terms "increase" or "decrease" or similar terms are relative terms with respect to electrical signals because an increase of one polarity may be considered a decrease of the opposite polarity. Furthermore, the term "field effect transistor" or "FET" includes those devices having a plurality of parallel connected FET devices. The term "increasing function" is used as a mathematical term which designates a mathematical relationship between the function and a variable, such that the function increases as the variable increases and the function decreases as the variable decreases.

DETAILED DESCRIPTION

Field effect transistors, like other semiconductor devices, are limited, among other things, by the amount of heat which can be safely generated within the device and conducted away without damaging the device. Because such power dissipation in an FET is principally the product of drain current multiplied by source to drain voltage, a typically and conventionally plotted characteristic for such a device is a somewhat rectangular graph of operating voltage versus operating current. This defines a region within which the device may be operated safely in a continuous steady state condition in which the heat generated in the device can be dissipated. This steady state region is surrounded by an area into which temporary excursions are allowable. Excursions may be for lesser times when they cause dissipation of greater power or for greater times when less power is dissipated. In typical operating characteristics, a maximum transient time during which the transistor can temporarily exceed its maximum average power dissipation rating may be determined based upon the maximum current which will be permitted.

The resistive component of most load impedances increases as a function of load temperature. Because the temperature changes in an incandescent lamp are so extreme in going from off to on, the time-dependent variation of the load resistance is a significant factor. If full power source voltage is applied to a cold incandescent lamp as a step function, initial current will be extremely high because the cold lamp filament has such a low resistance. Only after the lamp filament heats will the current fall to a steady state level. Such high initial current during the warmup transition of the lamp would destroy an FET. For example, an auto headlamp which is rated to draw 5 amps during steady state operation may draw 50-70 amps when full voltage is first applied. For some lamps, the start up current may be 20 to 50 times the steady state current.

It would therefore be preferable to turn on an incandescent lamp or similar load with an FET by first applying a relatively small voltage to the lamp to begin the warmup of its filament and thus begin the increase of its load resistance. Further, it would be desirable that the load be turned on at an initial high rate of change of input voltage with respect to time in order to rapidly initiate the heating of the cold filament, but to do so in a manner which maintains the field effect transistor, which controls the current, within its safe power dissipation operating range.

In accordance with the present invention, it is intended to turn on the FET at a rate which would dissipate the maximum power which can be dissipated in the FET under worst case, short circuit conditions. Under short circuit conditions, the full power supply voltage will appear across the FET. A control voltage is applied to the FET gate which, if a short circuit exists, would drive the FET to its maximum current within a time interval which is short enough not to damage the transistor but long enough to permit significant heating of the load. The transistor must be, and as described below will be, turned off if such a current exists at the end of that time interval.

In addition, it is known that incandescent lamps should be warmed up sufficiently slowly to avoid thermo-mechanical shock to the lamp and thus minimize the stress and maximize the life of the lamp. An exponential function meets these desirable characteristics.

The typical forward transfer ratio characteristic for an FET, which describes the relationship between the drain to source current and the gate to source voltage, shows that typically a field effect transistor begins turning on at a gate to source voltage of approximately three volts and is totally on at approximately eight or ten volts. Since power FETs are actually a plurality of parallel, discrete FETs, this transfer characteristic is approximately the same for power FETs.

Therefore, when turning on an incandescent lamp with an FET, it is desirable that the gate voltage of the FET be brought rapidly to its approximately 3 volt turn on voltage, that the load current then be increased initially at a relatively high rate, and that this be done in a manner which, at any instant an overload fault is detected, allows the FET to be turned off without the device having generated more heat than can be safely dissipated. Thus, the voltage must be applied to the load sufficiently rapidly that the FET switching device does not exceed its safe power dissipation operating range, but sufficiently slowly to allow warm up the incandescent lamp filament before full voltage is applied to the lamp.

FIG. 1 illustrates an idealized and simplified embodiment of the present invention to illustrate its theory and principles of operation. FIG. 1 illustrates a power switching FET transistor 1 which is series connected to a power supply 2 and a load 3. The transistor has a pair of output current controlling terminals 4 and 5 and a control input 6.

An input control signal means 7 applies a control signal to the transistor 1 for turning on the transistor as an increasing function of time. Preferably it drives the control input 6 to an input amplitude corresponding to a selected maximum output terminal current which is not destructive of the transistor and drives it to that current within a time interval. The time interval is sufficiently short that under a short circuit load during which full power supply voltage is applied to the output terminals 4 and 5, the power dissipation rating for the transistor would not be exceeded.

The detecting, integrating, and averaging circuit means 8 detects a power signal from the output terminals 4 and 5 which is substantially an increasing, continuous function of the instantaneous power dissipated in the transistor 1. Thus, for example, the circuit means 8 can receive both the transistor current from source terminal 5 for detecting the current and the source to drain voltage from the terminals 4 and 5. From these, instantaneous power can be determined in any of a variety of ways which are well known in the art. The circuit means 8 further integrates this instantaneous power signal over a time interval to provide a short term power dissipation signal for that time interval. The time interval is selected so that it does not exceed the maximum transient time during which the transistor 1 can temporarily exceed its maximum average power dissipation rating.

A comparator circuit means 9 compares the integrated short term power signal to a maximum average power dissipation rating signal which is applied at input 11. The output of the comparator means 9 causes the control signal circuit means 7 to turn the transistor 1 at least partially, and preferably completely, off if and when the integrated short term power signal exceeds the maximum average power dissipation rating signal for the transistor 1.

Figure 3:
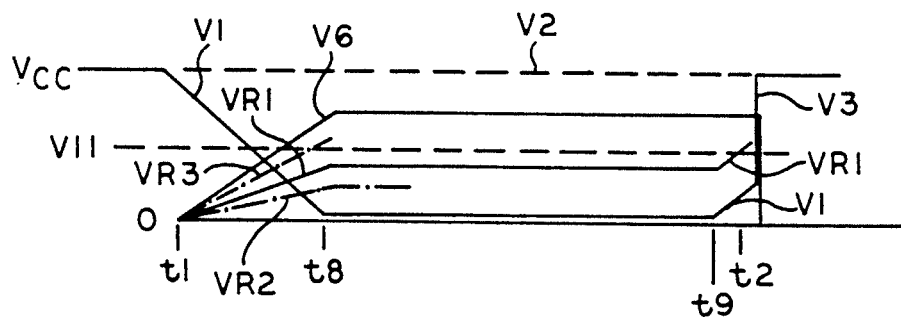
FIG. 3 is an oscillogram illustrating the operation of a simplified and idealized version of the invention.

The operation of the idealized circuit illustrated in FIG. 1 is illustrated in FIG. 3. The voltage level V11, which is input to the comparator 9 and represents the maximum average power which can be dissipated in the transistor, is illustrated as voltage level V11 in FIG. 3.

The input control signal V6 is initiated and applied to the FET 1 to turn on the transistor as an increasing function of time. An idealized FET would immediately begin conducting. For non-overload condition, the voltage V1, across the output terminals 4 and 5 of the transistor 1, would begin falling to 0 volts. The instantaneous power dissipated in the FET 1 is, of course, the product of instantaneous voltage multiplied by instantaneous current. Its integral, represented by a reference signal VR1 would rise until the voltage across the idealized FET fell to 0 volts. Thereafter the integral VR1 would continue level and its amplitude would represent the accumulated total energy dissipated in the transistor.

In the event that the load 3 would decrease in impedance and become an overload at time t9, the voltage V1, across the FET output terminals 4 and 5, would rise. This increase in instantaneous power dissipated in the FET 1 would be integrated by the circuit means 8 and drive the reference signal VR1 above the critical level V11. This is a transition of the signal VR1, which represents the integral of the instantaneous power, above the transition level V11 which represents the maximum average dissipation rating for the transistor. That transition causes a signal from the comparator 9 to be applied to the control signal circuit means 7 for driving the control input voltage V6 at the gate 6 of the FET 1 to 0 volts, thus turning off the FET 1 and causing the FET output terminal voltage V1 to return to the voltage of the power supply 2 as the current ceases.

If, instead, a higher impedance load 3 is connected in the circuit, then power will be applied to that load at a lower instantaneous rate and thus, the integral of the power, illustrated in FIG. 3 as VR2, will rise at a slower rate to a lower amplitude than VR1.

If, instead, the load 3 is a very low impedance or short circuit, the instantaneous power will be considerably greater and therefore the integral of that power, illustrated in FIG. 3 as VR3, will rise at a higher rate. It will make its transition earlier through the critical level V11 which will again cause the control signal circuit means 7 to turn off the FET 1.

The idealized model of FIGS. 1 and 3, as described above, does not account for the facts that a practical FET or other transistor always has a finite voltage drop across its output terminals 4 and 5 and additionally is able to dissipate thermal energy. Thus, in a practical embodiment of the invention the circuit means 8 detects and integrates the instantaneous power in the FET 1 over a short term time interval. By continuously providing an output signal which represents the integral of instantaneous power over the immediately preceding short term time interval, an output signal VR from the circuit means 8 is provided which represents a continuous or running average of the instantaneous power over the short term time interval.

The short term time interval over which the integration occurs should not exceed the transient time during which the transistor is shown in its characteristic curves to be capable of temporarily exceeding its maximum, average power dissipation rating. Such a time may, for example, be on the order of 10 milliseconds in some practical embodiments of the invention.

The principles of the present invention can be applied in either digital or analog circuitry. Analog circuitry is preferred because the principles can be carried out in close approximation at considerably less expense.

Figure 2:
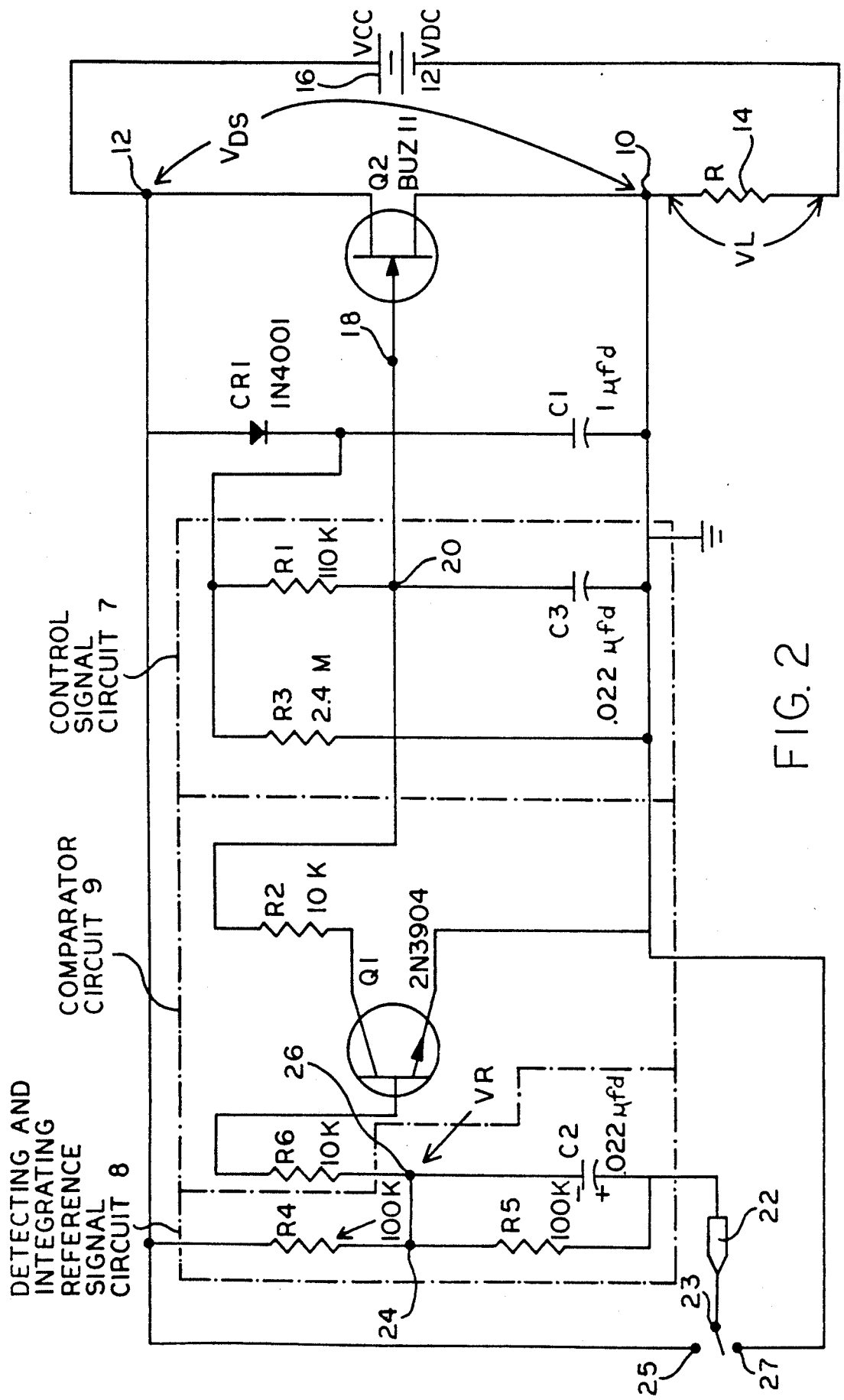
FIG. 2 is a schematic diagram of the preferred embodiment of the invention.

FIG. 2 illustrates the preferred circuit embodying the present invention. The circuit portions which correspond to the components 7, 8, and 9 of FIG. 1 are outlined in phantom. The FET Q2 has its switching terminals 10 and 12, representing the source and drain terminals respectively, connected between the series connected power supply 16 and load 14, such as an incandescent lamp. The FET Q2 has a control input gate terminal 18. Like all standard FETs now known and used, the FET has a linear operating region to permit its control input device 18 to control the current flowing through the device and the load 14.

When the FET Q2 is turned off, operating power is supplied from the power supply 16 to the circuit elements which are connected to the control input circuit of the gate 18 as a trickle through the load 14. However, a first circuit means is needed for supplying electrical operating power to those circuit elements when the switching device Q2 is turned on and presents an effective short circuit between its output terminals 10 and 12.

The preferred first circuit means comprises a series first capacitor C1 and diode CR1 which are connected across the switching terminals 10 and 12 of the FET Q2. The capacitor is connected to the source terminal 10 and the diode is connected in a polarity to permit the first capacitor C1 to be charged by the power supply 16 when the FET Q2 is turned off. Thus, the capacitor C1 provides the energy source operating as a power supply for other portions of the gate control circuit when the FET Q2 is on.

A control signal circuit means 7 is connected to that power supplying means provided by capacitor C1 and has an output terminal connected to the control input gate 18 of the FET Q2. In particular, the control signal circuit means comprises a series first resistance R1 and third capacitance C3 which are connected across the power supplying first capacitor C1 and have the gate 18 connected to the node 20 between the capacitor C3 and the resistor R1.

This control signal circuit means applies a selected time changing control signal to the gate 18 for turning on the FET Q2 with a time changing signal which is exponential.

The intermediate node 20, between resistor R1 and capacitor C3, is the terminal for the application of the signal which initiates the turning on of the FET by the exponential voltage generated by resistor R1 and capacitor C3. Alternatively, the time changing control signal applied to the gate 18 is reversed in the event a fault condition is detected because excessive power has been dissipated in the FET Q2.

Generally the values of R1 and C3 are chosen to provide an exponential increase of the voltage at gate 18 of the FET Q2 which will maximize the power dissipation in the FET Q2 if the load presented to it is a short circuit, but will do so within a sufficiently short time so that the transistor can be turned off at the end of that time without exceeding the maximum transistor power dissipation and therefore without causing damage to the transistor. Thus, because it is desirable to turn on the load rapidly in order to heat it up, the control signal circuit 7 turns the transistor on as rapidly as is possible under worst case short circuit load condition, but for a time which is sufficiently short that the transistor can be turned off without damaging the transistor if such an overload condition is detected.

In particular, the control signal circuit is designed so that the gate 18 of the FET Q2 will be driven to a voltage at a time t2 which would supply the maximum permissible current through the FET to a short circuited load with t2 being selected to be a time which is sufficiently soon after the time the FET Q2 is first turned on that the FET may be turned off at time t2 without being damaged. Thus, it can be seen that the choice of t2 and the gate voltage at time t2, represent a two variable trade off with respect to maximum power dissipation. The maximum current may be greater if the time t2 is earlier or less if time t2 is later. However, the device is current limited. Furthermore, it is desirable to turn on the load, particularly an incandescent lamp, sufficiently slowly as to not cause thermo-mechanical shock. Therefore, it is preferred to select the maximum current and then choose the time t2 at which the power dissipation in the FET Q2 is maximum. Of course, these numbers may be reduced to permit typical engineering safety factors or to take other design criteria into account. In any event the choice of time t2 and the gate voltage at t2 determines the exponential curve and therefore the component values of R1 and C3.

In the comparator circuit 9, a bipolar transistor Q1 has its output collector and emitter terminals series connected to a resistor R2 and this series pair is connected across the third capacitor C3.

The bipolar transistor Q1 is turned on to reverse the exponential gate control signal applied to the FET gate 18 by discharging the capacitor C3 and thus turning off the FET Q2 in the event that the integrated short term instantaneous power integral exceeds the maximum power rating of the FET Q2. Alternatively, the transistor Q1 is turned off to initiate the charging of capacitor C3 to begin the application of the exponential control signal to the gate 18 of the FET. The bipolar transistor Q1 is turned off in response to the application of a first input control signal at the control gate 22 to initiate the turn on of the FET Q2 and charging of the capacitor C3 through the resistor R1.

The detecting and integrating reference signal circuit means 8 comprises a series connected capacitor C2 and base resistor R6 which are connected between the control input gate 22 and the input terminal to the base of the bipolar transistor Q1. The detecting and integrating circuit means further includes a resistor R4 and a resistor R5 which are connected as a voltage divider between the drain terminal 12 of the FET Q2 and the control input gate 22. The intermediate node 24 of the voltage divider formed by resistors R4 and R5 is connected to the node 26 which is intermediate the base resistor R6 and the capacitor C2.

Turning on of the load 14 is initiated by switching the switch 23 from terminal 25 to terminal 27, or by providing an analogous voltage transition.

Figure 10:
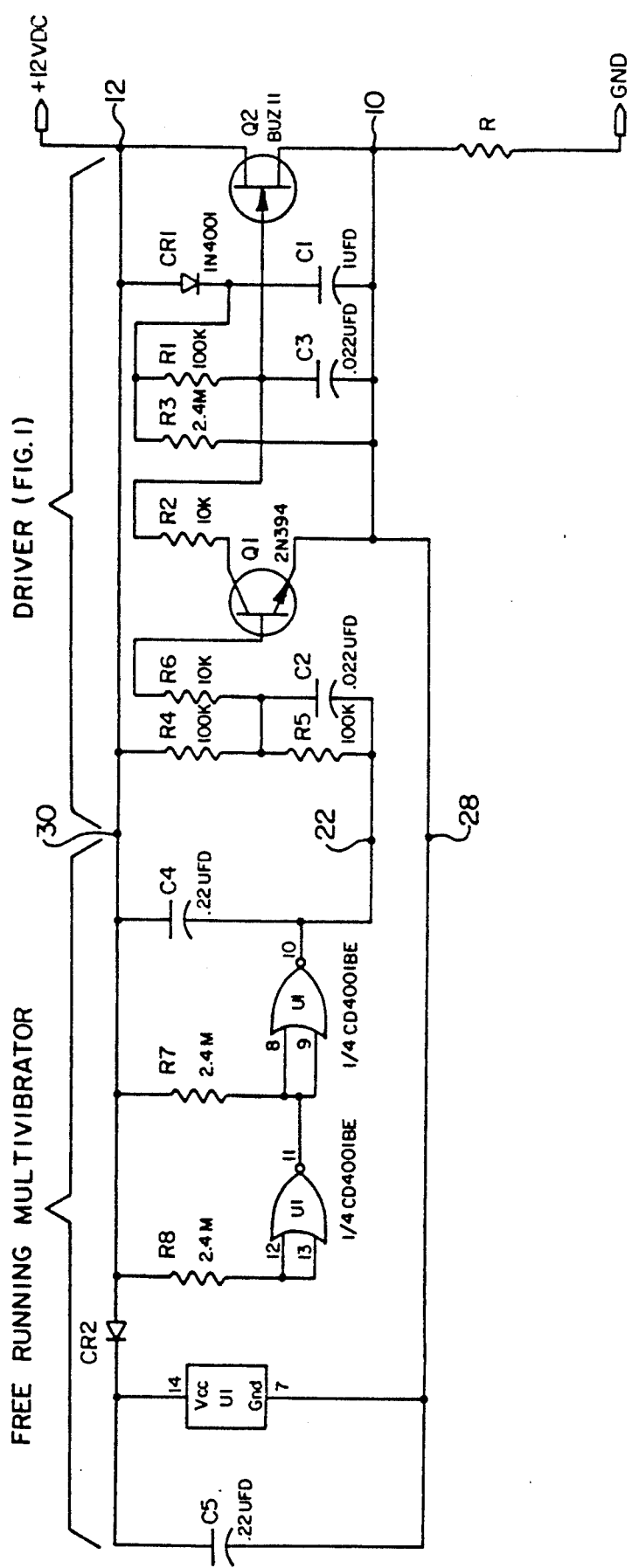
FIG. 10 is a schematic diagram of the preferred embodiment illustrated in FIG. 2, but also having a free running multi-vibrator connected to its control input terminal to form a two terminal flasher.

For example, FIG. 10 illustrates the connection of a free running multi-vibrator which applies a periodic square wave to the control input terminal 22. The multi-vibrator is also connected at terminal 28 to the source terminal 10 and at the terminal 30 to the drain terminal 12 for receiving operating power. Its operating power is obtained from a capacitor C5 which charges through a diode CR2 and operates in the same manner as the series diode CR1 and capacitor C1 of FIG. 1.

Referring now to the operation of the circuit of FIG. 2, reference is made to FIGS. 4–9.

Figure 4:
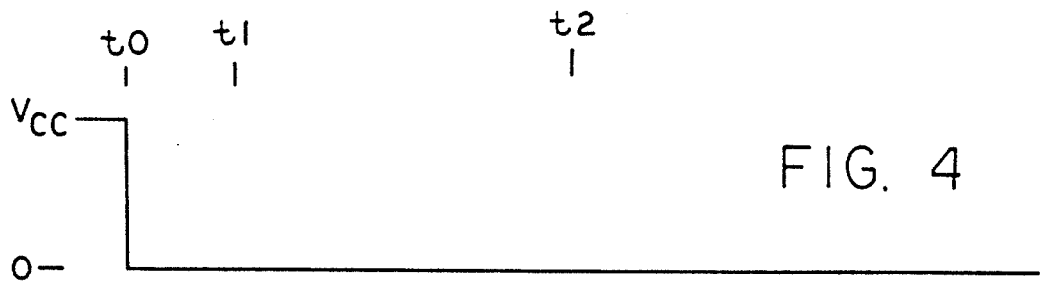
FIG. 4 is an oscillogram illustrating a representative, typical signal at the gate 22 of the circuit of FIG. 2 for illustrating the operation of the preferred embodiment of the invention.

In a steady state off condition for the circuit of FIG. 2, the control gate input terminal 22 is held at 12 volts prior to time t0 as illustrated in FIG. 4. In this condition, base current through Q1 flows through the gate input terminal 22, through resistor R4, through resistor R6 and through the load 14, holding transistor Q1 on. With transistor Q1 turned on, capacitor C3 is short circuited and therefore the gate 18 of FET Q2 is connected to its source terminal 10 holding the FET Q2 in its off state. Thus, there is a steady state, off, equilibrium state for the circuit of FIG. 2.

In its steady state on condition, the gate control input terminal 22 is held at zero volts after time t0 as illustrated in FIG. 4. Under normal operating conditions, with FET Q2 in its on state, the drain terminal 12 voltage is only a volt or so above the source terminal 10 voltage. The base terminal of transistor Q1 is held by the voltage divider, formed by resistors R4 and R5, at a voltage, which is intermediate the potentials of the source and drain terminals of the FET Q2. The resistors R4 and R5 of the voltage divider are selected by the designer so that when the FET Q2 is conducting with its maximum, steady state current and has across it the maximum permissible, steady dissipation rating for the transistor Q2, the potential at node 24, between the resistors of the voltage divider is slightly less than the forward voltage drop across the base emitter junction of transistor Q1. That forward diode voltage is the voltage which switches the transistor Q1 into conduction if applied to its base. Thus, during normal steady state operation with the FET Q2 operating at maximum current, the transistor Q1 will become conducting and discharge the capacitor C3 when the potential at node 26 makes a transition to exceed the forward voltage drop on the base emitter junction. Therefore, the forward drop on the base emitter junction is a critical threshold voltage which can be used to represent the maximum power dissipation rating. Under reduced loads, that is higher impedance loads, the voltage between the source and drain will be less than this critical threshold voltage and therefore the base-emitter junction of Q1 will be reversed biased and Q1 will be held off or non-conducting.

An advantage of the circuit of this invention is that the identical circuit will work for different power FETs operating different loads. The only change needed will be the variation of the relative scale of the resistors R4 and R5 tailoring them to each FET so that the same operating conditions will occur.

With Q1 held non-conducting, the capacitor C3 charges through resistor R1 and diode CR1 to a potential which is essentially equal to the drain to source potential across the FET Q2 minus the small voltage drop across the diode CR1. The gate 18 of the FET Q2 therefore rises essentially to the drain potential thereby holding the FET Q2 on. Therefore, the circuit of FIG. 1 also has a steady state on equilibrium condition.

The transient operation of the circuit embodying the present invention is the manner of making the transition from the off to the on state of the FET Q2 in a manner which assures that the FET Q2 is protected and will be turned off in the event an overload condition is encountered.

Referring to FIGS. 4–9, the circuit of FIG. 2 begins in the steady state, Q2 off condition prior to time t0 as a result of the application of a 12 volt input level to the control gate, 22. The capacitor C2 will be charged to 12 volts in the polarity illustrated on FIG. 2 so that the node 26 is at the voltage of the forward voltage across the base emitter junction which is at approximately ground or 0 volts. The capacitor C2 charges to this voltage and polarity by Q1 base current through the resistor R6, the base emitter junction of Q1 and the load 14. The voltage across the capacitor C3 is at zero volts because the transistor Q1 is conducting. The load voltage V1 is also at zero volts.

At time t0 a signal is applied to the control gate input 22 to initiate the turning on of the load 14. This signal is a level transition from the +12 volt level to the 0 volt level at the gate control terminal 22 as illustrated in FIG. 4. The reference voltage VR at the node 26 is instantaneously lowered to −12 volts, as illustrated in FIG. 5-8, which immediately turns off transistor Q1. This in turn immediately initiates the charging of capacitor C3 which controls the voltage V(C3) applied to the gate 18 of FET Q2 to begin its exponential rise as illustrated in FIGS. 5-8.

Figure 6:
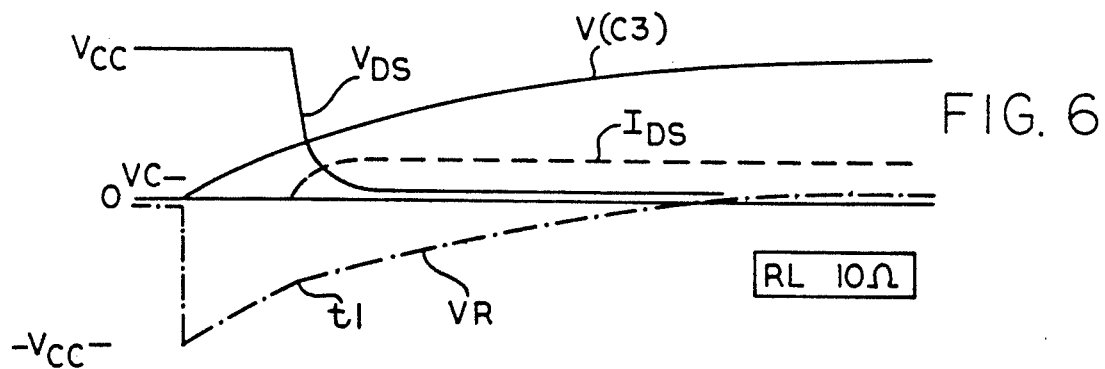
FIG. 6 is an oscillogram similar to the oscillogram of FIG. 5, but illustrating operation of the invention with a high resistance load.

At time t1 the voltage V(C3) across capacitor C3 becomes sufficient, approximately 3 volts, to begin turning on the FET Q2. Therefore, at the time t1 voltage begins to be applied to the load 14 and the load voltage VL rises and simultaneously the FET voltage VDS falls. Illustrated as an example in FIG. 6 is the fall of VDS for a high resistive load voltage on the order of 10 ohms. FET voltage VDS falls rapidly to its steady state condition.

Therefore, it can be seen that, when turning on the FET Q2 is initiated, the reference voltage VR initially is switched to an offset value −VCC. The voltage on the capacitor C2 is thereafter a time function of the sum of this initial offset voltage and the voltage across the source and drain terminals 0 and 12. In particular, the voltage VR as a function of time may be given by the equation:

$$VR = \left[ V_{DS}(t)\left(\frac{R5}{R4+R5}\right) + V_{CC} \right][1 - e^{-t/T}] - V_{CC}. \quad \text{I}$$

The initial voltage on capacitor C2 of −12 volts represents the amount of energy which can be dissipated by the FET Q2 when turned on from a fully off state. Since the FET is a current device, its drain source current is a function of its gate voltage V(C3). The gate voltage is a controlled variable and thus is predetermined during the turn on transition and as a result the drain-source current is predetermined. Therefore, the power dissipated in the FET is an increasing function of FET voltage. Consequently, integration of the FET voltage provides a value which is a function of accumulated energy. Consequently, the circuit of the present invention integrates this instantaneous voltage to obtain a signal at the input to the transistor Q1 which is an increasing function of accumulated energy over the time of the integration which, thus, represents a short term power.

Figure 7:
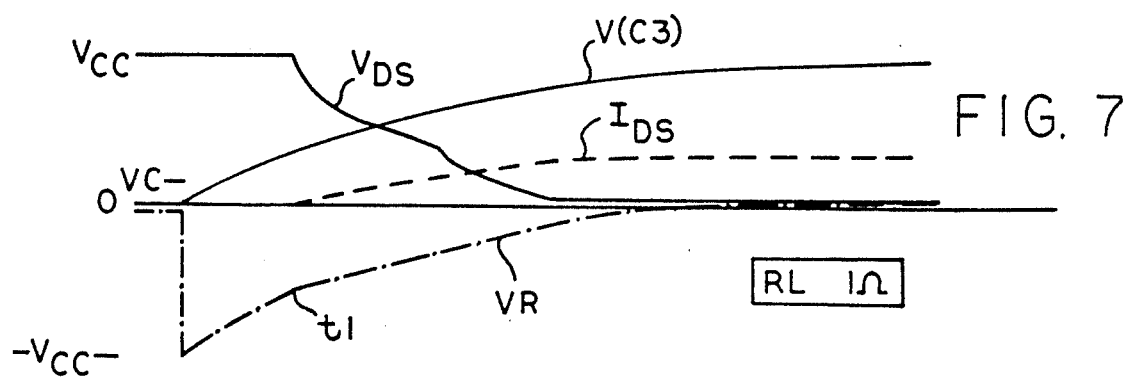
FIG. 7 is an oscillogram similar to that of FIGS. 5 and 6, but illustrating the operation of the preferred embodiment of the invention under a low impedance, nonoverload condition.

If the load has a considerably lower resistance than illustrated in FIG. 6, for example the 1 ohm load illustrated in FIG. 7, the drain to source voltage falls more slowly because a higher load current must be reached to drop the entire voltage of the power source 16 across a low resistance load 14. Thus, FIGS. 6 and 7 illustrate two normal, nonoverload, nonfault conditions for turning on a resistive load with the circuit of the invention. The reference voltage VR in FIGS. 6 and 7 remains at all times below the critical, threshold voltage VC which would forward bias the base-emitter junction of Q1 and turn it on to thereby turn off Q2.

Figure 5:
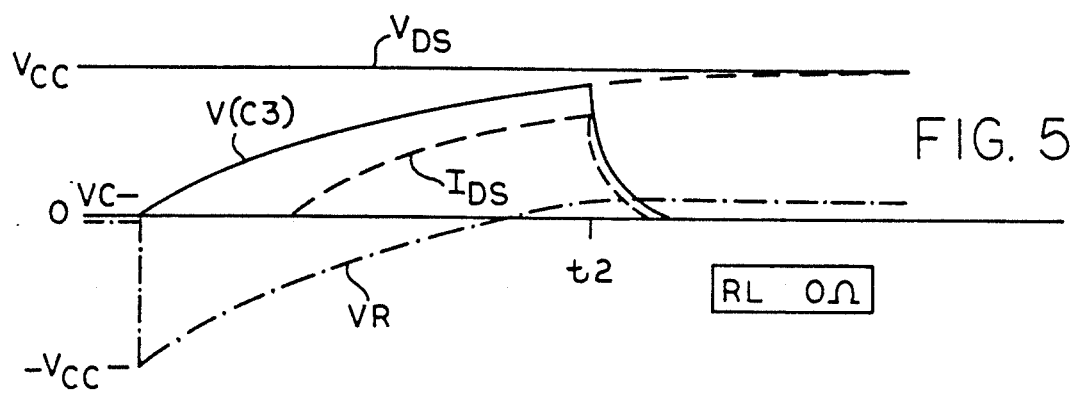
FIG. 5 is an oscillogram illustrating the operation of the preferred embodiment of the invention for a short circuit load.

FIG. 5 illustrates the turning on of the load 14 when the load is a dead short. Under that condition the load resistance is zero and the drain to source voltage remains at VCC as illustrated in FIG. 5. The reference voltage VR exponentially increases beginning at t0 and the drive voltage V(C3) across capacitor C3 also exponentially increases to turn on the FET Q2 in the same manner as illustrated in FIG. 2. At time t2 the reference voltage VR will rise above the critical voltage VC. When that occurs the base emitter junction of the transistor Q1 will become forward biased turning on the transistor Q1 which in turn discharges capacitor C3. Thus, at time t2 the drive voltage V(C3) is switched to zero essentially as a step function turning off the FET Q2 and thus protecting the FET.

Therefore, it is apparent from the circuitry as well as from equation I that a greater power dissipation in the FET Q2 is the result of the appearance of a voltage across a drain to source terminals which remains greater longer and this greater drain to source voltage drives the voltage of capacitor C2 at a greater rate towards the critical threshold voltage VC.

Figure 8:
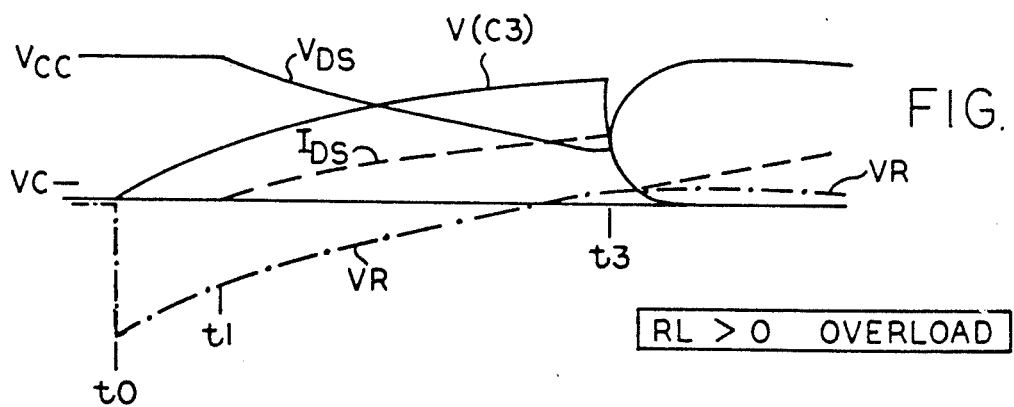
FIG. 8 is an oscillogram similar to the oscillograms of FIGS. 5-7 illustrating the operation of the preferred embodiment of the invention under a low impedance overload condition.

FIG. 8 illustrates the circuit operation for a load 14 which is of a finite, but overload impedance for the FET Q2. The reference voltage VL and the voltage V(C3) on the capacitor C3 begin increasing exponentially as described above. At time t1 the drain source voltage VDS voltage, illustrated for a 0.25 ohm resistive load, begins decreasing exponentially after the gate voltage of the FET Q2 rises above approximately 3 volts. This begins to turn on the load in the same manner as illustrated in FIGS. 5–7. However, at time t3 when the reference voltage VR at node 26 rises above the critical threshold voltage VC, the transistor Q1 will again be turned on to discharge the capacitor C3 and thereby turn off the FET Q2 in the manner described above.

Therefore, the circuit embodying the present invention provides overload protection for the circuit and the FET in the event a short or an overload is encountered at any time during the start up or turn on cycle.

Figure 9:
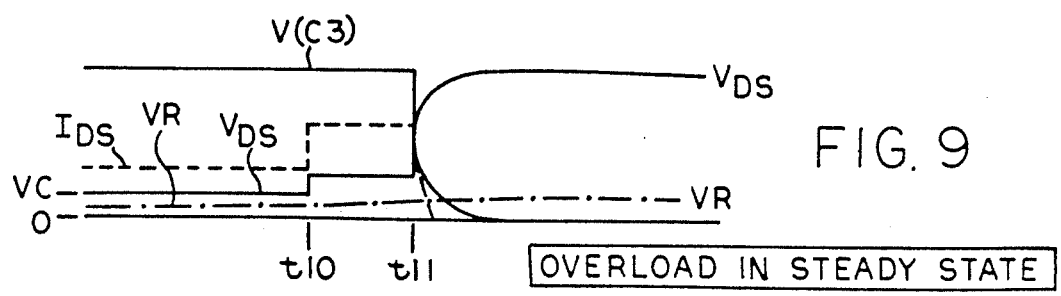
FIG. 9 is an oscillogram similar to those of FIGS. 2-7, but illustrating steady state operation of the preferred embodiment of the invention in response to a detected overload condition.

FIG. 9 illustrates operation of the embodiment if an overload is encountered during steady state operation. Prior to the overload condition, the circuit will be operating in steady state beyond the first five time constants illustrated in FIGS. 4–8. If at time t10 an overload is encountered, the overload would cause load voltage to drop, thereby causing drain-source voltage VDS to rise. This increase in VDS will be integrated causing the reference voltage VR to gradually rise until, at time t11, for example, it rises above the critical threshold voltage VC. At time t11 the transistor Q1 would again be turned on to discharge the capacitance C3 and thereby immediately turn off the FET Q2.

The circuit of the present invention may be used not only for driving incandescent lamps, but also may be used for driving other devices to operate as a DC relay having both the high efficiency and quick response time of an FET, but with the protection described above. The built in diode of the FET provides the conventional reverse bias protection available on conventional FETs.

The circuit of the present invention may also be used as a light dimmer by variably controlling the duty cycle of the multi-vibrator which controls its control input gate 22.

Figure 11:
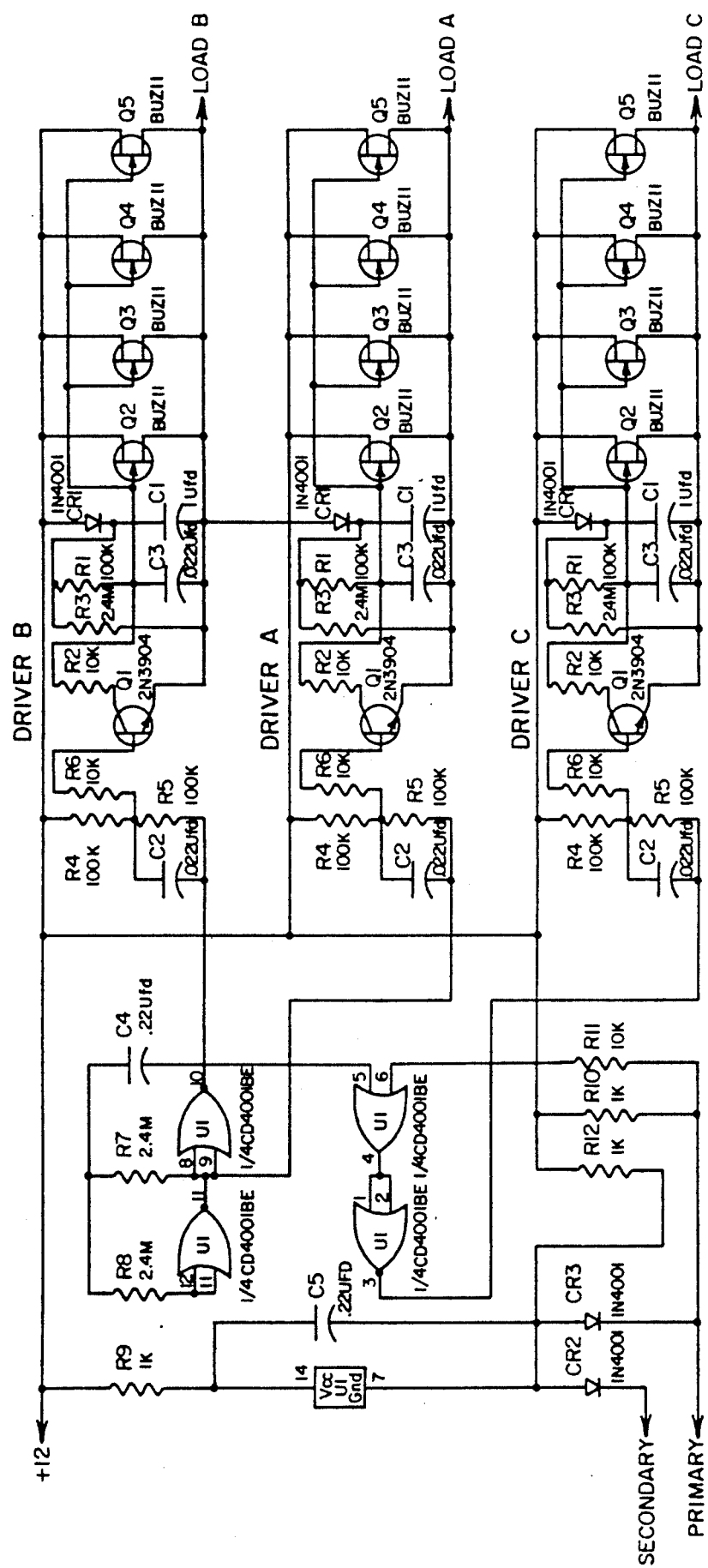
FIG. 11 is a schematic diagram illustrating a six terminal flasher for operating three different loads and embodying the present invention.

FIG. 11 illustrates an embodiment of the invention utilizing multiple parallel FETs which are equivalent to the FET Q2 illustrated in FIG. 1. In addition, the circuit of FIG. 6 has three circuits for driving three different loads and a control circuit consisting of a multi-vibrator and frequency dividers for operating the drivers at different frequencies. Its input terminals labelled secondary and primary provide a switch for turning on and off the flashing operation of the three different loads.

While certain preferred embodiments of the present invention have been disclosed in detail, it is to be understood that various modifications may be adopted without departing from the spirit of the invention or scope of the following claims.

I claim:

1. A method including both switching on a power switching transistor, which is series connected to a power supply and a load, said transistor having a region of substantially linear operation, and including protecting said transistor from excess internally generated heat, said transistor having a pair of output current controlling terminals and a control input, said method comprising:

(a) initially applying an input control signal to the transistor control input for turning on the transistor as an increasing function of time, (b) detecting a power signal from said output current controlling terminals of the power switching transistor which power signal is substantially an increasing, continuous function of the instantaneous power dissipated in the transistor said power signal being detected and integrated by switching a reference signal to a first amplitude level and then driving the reference signal from the first amplitude level toward a second amplitude level by a reference drive signal which reference drive signal is an increasing continuous function of the voltage across said output terminals;

(c) integrating the instantaneous power signal over a time interval which does not exceed the maximum transient time during which the transistor can temporarily exceed its maximum average power dissipation rating to obtain a short term power dissipation signal for that time interval;

(d) comparing the integrated, short term power signal to a selected maximum average power dissipation signal said comparing step including comparing the reference signal to a selected critical reference amplitude level which level is interposed between said first amplitude level and said second amplitude level, said critical level being adjacent and on the second amplitude level side of the reference signal level and being at a selected maximum, steady state, transistor output terminal, on voltage, said critical level representing said maximum average power dissipation rating; and (e) turning the transistor at least partially off in response to the integrated, short term power signal exceeding the maximum average power dissipation signal, said turning off step including switching the amplitude of the transistor control signal to an amplitude level which switches off the transistor if the reference signal makes an excursion through said critical reference level.

2. A method in accordance with claim 1 wherein said control signal is an exponential function of time until a maximum valve is reached.

3. A method in accordance with claim 2 wherein said reference signal is an exponential function of time until a maximum valve is reached.

4. A method in accordance with claim 3 wherein the voltage coefficient for the exponential time function of the reference signal comprises the algebraic sum of said first amplitude level and a portion of the voltage across said output terminals.

5. A switching apparatus including a power switching transistor having a region of substantially linear operation, said transistor having a pair of output terminals and a control input, said apparatus further comprising:

(a) input control signal circuit means for initially applying an input control signal to the power transistor control input for turning on the transistor as an increasing function of time;

(b) detecting and integrating circuit means for detecting a power signal from said output terminals which signal represents the instantaneous power dissipated in the transistor and integrating the instantaneous power signal over a time interval which time interval does not exceed the maximum transient time during which transient time the transistor can temporarily exceed its maximum average power dissipation rating to obtain a short term power dissipation signal for that time interval, said detecting and integrating circuit means including a reference signal generating circuit means having an input gate terminal and connected to the output terminals of the power transistor for generating a reference signal which signal, upon actuation of the input gate of the reference generating circuit varies as an increasing function of time from a first amplitude level toward a second amplitude level as an increasing function of the voltage across the output terminals of the transistor; and (c) comparator circuit means for comparing the integrated power signal to a selected maximum average power dissipation signal and for turning the transistor at least partially off in response to the integrated power signal exceeding the maximum average power dissipation signal, said comparator circuit means including an output connected to the control signal circuit means for enabling and disabling the application of said control signal to said power transistor and an input connected to the reference signal generating circuit means for enabling the application of said control signal to the transistor in response to a first signal at the gate of the reference signal circuit means and for disabling the application of said control signal if said reference signal makes an excursion through a selected critical reference amplitude level representing said maximum average power dissipation signal.

6. An apparatus in accordance with claim 5, wherein said control signal circuit means comprises a resistive-capacitive circuit for charging a capacitor from a first voltage at which the power transistor is off to a second voltage at which the power transistor is on.

7. An apparatus in accordance with claim 6 wherein the comparator circuit means is connected to the capacitor of the control signal circuit means for discharging that capacitor in response to the excursion of the reference signal through the selected critical reference level.

8. An apparatus in accordance with claim 7 wherein said reference signal circuit means comprises a resistive-capacitive circuit for charging a capacitor, the reference signal being proportional to the voltage of the reference signal circuit capacitor.

9. An apparatus in accordance with claim 8 wherein said comparator circuit means further comprises a transistor having its output terminals connected across the capacitor of the control signal circuit means.

10. An apparatus in accordance with claim 9 wherein said gate terminal is connected to the capacitor of the reference signal circuit means.

11. An apparatus in accordance with claim 10 wherein the power transistor comprises an FET.

12. An apparatus in accordance with claim 5 or 6 or 7 or 8 or 9 or 10 or 11 further comprising an electrical power supplying circuit means for supplying electrical power to circuit elements in the input control signal circuit means, in the detecting and integrating circuit means and in the comparator circuit means when the power transistor is turned off, the power supplying circuit means comprising a series first capacitor and diode connected across the output terminals of the power transistor, the series first capacitor being connected to one output terminal and the diode connected to the other in a polarity to permit charging of said series first capacitor by said power supply which is connected in series with said power transistor and said load.

13. An apparatus in accordance with claim 12 wherein said input control signal circuit means comprises a series first resistor and third capacitor connected across said first capacitor and having the power transistor control input connected between the third capacitor and first resistor.

14. An apparatus in accordance with claim 13 wherein comparator circuit means comprises a bipolar transistor having its output terminals series connected to an energy dissipating second load resistor, the series pair of said bipolar transistor and said second load resistor being connected across said third capacitor, the bipolar transistor having its input terminal connected to the reference generating circuit means.

15. An apparatus in accordance with claim 14 wherein said reference generating circuit means more particularly comprises a second capacitor connected to the input terminal of said bipolar transistor and further comprises fourth and fifth resistors connected as a voltage divider between the output terminals of the power transistor and with the intermediate node of the voltage divider connected to the second capacitor.

16. An apparatus in accordance with claim 5 or 6 or 7 or 8 or 9 or 10 or 11 further comprising an incandescent lamp as said load.

17. An apparatus in accordance with claim 5 or 6 or 7 or 8 or 9 or 10 or 11 wherein a free running multivibrator is connected to the input gate terminal of said reference generating circuit means to provide a flasher.

* * * * *